United States Patent
Tseng et al.

(10) Patent No.: US 8,489,379 B2
(45) Date of Patent: Jul. 16, 2013

(54) EQUIVALENT CIRCUIT SIMULATION SYSTEM AND METHOD FOR HSPICE

(75) Inventors: Wen-Laing Tseng, Taipei Hsien (TW); Cheng-Hsien Lee, Taipei Hsien (TW); Shen-Chun Li, Taipei Hsien (TW); Yu-Chang Pai, Taipei Hsien (TW); Shou-Kuo Hsu, Taipei Hsien (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 280 days.

(21) Appl. No.: 12/962,838

(22) Filed: Dec. 8, 2010

(65) Prior Publication Data
US 2011/0301923 A1      Dec. 8, 2011

(30) Foreign Application Priority Data
Jun. 7, 2010   (TW) ................................ 99118422 A

(51) Int. Cl.
*G06F 17/50*      (2006.01)
*G06F 7/60*       (2006.01)
*G06F 17/10*      (2006.01)

(52) U.S. Cl.
USPC ............................................. 703/14; 703/2

(58) Field of Classification Search
USPC .......................................... 703/14, 2
See application file for complete search history.

(56) References Cited

U.S. PATENT DOCUMENTS

| 6,998,833 B2 * | 2/2006 | Wang et al. ................ 324/76.12 |
| 2003/0065498 A1 * | 4/2003 | Bois et al. ........................ 703/19 |
| 2007/0005325 A1 * | 1/2007 | Gong et al. ...................... 703/14 |
| 2007/0038428 A1 * | 2/2007 | Chen ............................... 703/14 |
| 2009/0171604 A1 * | 7/2009 | Lin et al. ......................... 702/75 |

OTHER PUBLICATIONS

Adam Lamecki, NPL, "Equivalent SPICE Circuits with Guaranteed Passivity From Nonpassive Models", IEEE, Mar. 2007.*
Mohamed Abdel-Rahman, NPL, "Two-Layer Network Equivalent for Electromagnetic Transients", IEEE, Oct. 2003.*
Agilent Technologies, NPL, "Broadband SPICE Model Generator", May 2007.*
Bjorn Gustavsen, NPL, "Fast Passivity Enforcement for S-Parameter Models by Perturbation of Residue Matrix Eigenvalues", Feb. 2010.*

* cited by examiner

*Primary Examiner* — Omar Fernandez Rivas
*Assistant Examiner* — Angel Calle
(74) *Attorney, Agent, or Firm* — Altis Law Group, Inc.

(57) ABSTRACT

A simulation system and method for generating equivalent circuits compatible with HSPICE reads data corresponding to N-port network system format in a storage device, and obtains S-parameter matrixes from the N-port network system. S-parameters in the S-parameter matrix that satisfy passivity are checked, and an interpolation algorithm to supplement S-parameters with passivity when some S-parameters not satisfy passivity is performed. Numbers of pole-residue, times for recursion and a tolerant system error of a rational function are generated for determining S-parameters. A rational function matrix composed of S-parameters is generated by performing a vector fitting algorithm, and an equivalent circuit is generated compatible with HSPICE format based on the generated rational function matrix.

15 Claims, 5 Drawing Sheets

EQUIVALENT CIRCUIT SIMULATION SYSTEM AND METHOD FOR HSPICE

BACKGROUND

1. Technical Field

The present application is related to simulation systems for circuits, especially to a simulation system and method for generating equivalent circuits compatible with HSPICE.

2. Description of Related Art

S-parameters are widely used in channel models of printed circuit boards (PCB). Using measuring instruments, such as network analyzer or full-wave type field solver software, such as HFSS of Ansoft Inc., S-parameters can be obtained for a channel system, and an equivalent full wave model for the channel system can also be obtained.

HSPICE, is a circuit simulation software developed by Synopsys Inc.; it uses Inverse Fourier Transform (IFT) to predict behavior of S-parameters in the time-domain. When S-parameters are combined with a system circuit, time-domain simulation of the system circuit will cost considerable time and delay the development of new products. Furthermore, S-parameters do not correspond to the passivity of circuits, and cause problems in convergence of time-domain solution of the simulation circuit.

DETAILED DESCRIPTION

Figure 1:
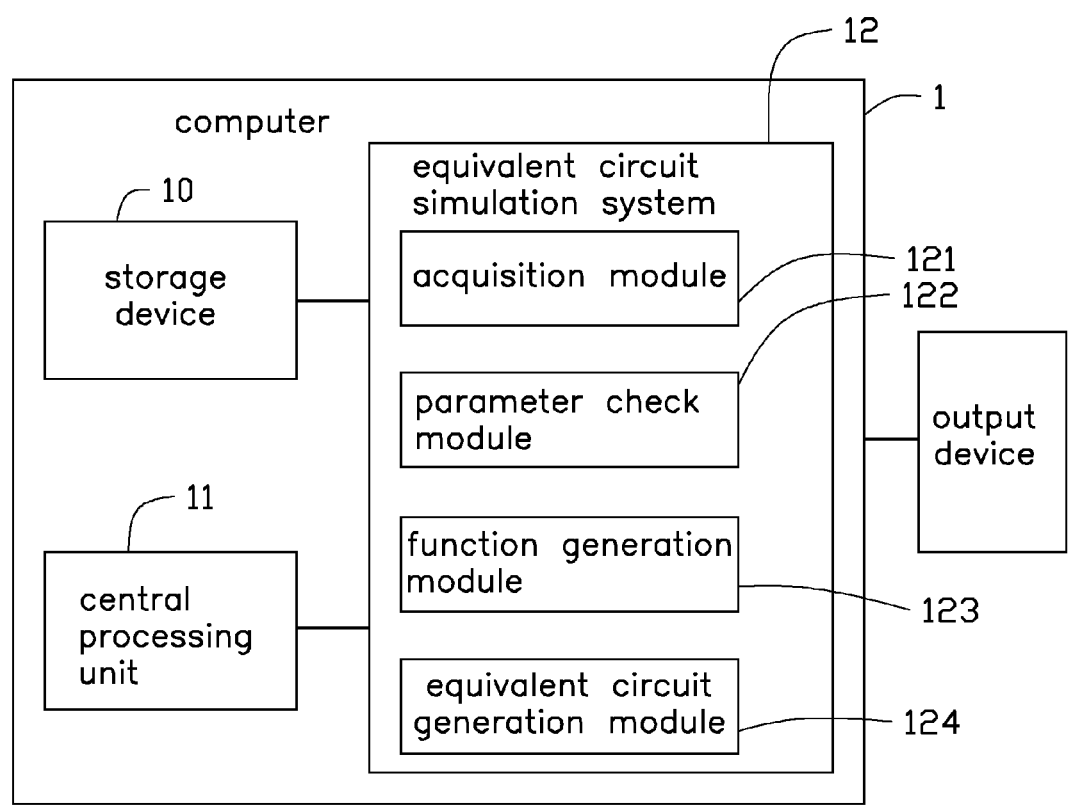
FIG. 1 is a block diagram of one embodiment of a computer comprising an equivalent circuit simulation system for HSPICE.

FIG. 1 is a block diagram of one embodiment of a computer 1 comprising an equivalent circuit simulation system for HSPICE 12. The computer 1 further comprises a storage device 10 and a central processing unit 11 (CPU). The computer 1 is connected to an output device 2, such as a display, for outputting generated equivalent circuits. The storage device 10 is configured for storing information of N-port circuit system in Touchstone format (such as *.SNP), including frequency domain parameters and S parameters of an electronic element. The Touchstone File Format Specification is stipulated by IBIS Associates. The equivalent circuit simulation system 12 is configured for reading N-port network parameter data presented in the Touchstone File, generating an equivalent circuit compatible with HSPICE, and outputting the equivalent circuit to the output device 2, such as a display. HSPICE, a commercial version of Simulation Program with Integrated Circuit Emphasis (SPICE), is a circuit simulator for generating equivalent circuits and predicting behavior of the generated circuits based on given circuit construction and electronic parameters. HSPICE stipulates a series of formats of input, output, connection, names and parameters of electronic elements.

In this embodiment, the equivalent circuit simulation system 12 includes an acquisition module 121, a parameter check module 122, a parameter generation module 123, and an equivalent circuit generation module 124. The storage device 10 may be a memory system of the computer 1. The modules 121-124 may comprise computerized code in the form of one or more programs that are stored in the storage device 10. The computerized code includes instructions that are executed by the at CPU 11 to provide functions for modules 121-124. Modules described here refer to a section of a computer program, which is able to perform particular functions.

The acquisition module 121 is configured for reading N-port network parameter data compatible with Touchstone File format in the storage device 10, and obtaining S-parameter matrixes in the N-port network parameter. The N-port network system shown in FIG. 3 defines the parameters in frequency domain and S-parameters. V1 to VN are voltage on ports 1 to N, $I_1$ to $I_N$ are currents flowing into ports 1 to N. The S-parameter matrix is a divergence matrix describing relationships between an incident voltage wave and a reflective voltage wave, and S-parameters are parameters in frequency domain built based on the relationships between the incident voltage wave and the reflective voltage wave.

The parameter check module 122 checks if all S-parameters in the S-parameter matrix satisfy passivity, and performs an interpolation algorithm to supplement S-parameters with passivity when some S-parameters do not satisfy passivity. Passivity is a property describing behavior of passive components, such as resistors, inductors, and capacitors, which only consume energy instead of having power gain.

The function generation module 123 is configured for generating numbers of pole-residue, times for recursion and a tolerant system error of a rational function f(S) creating S-parameters. The tolerant system error is a maximum error allowed to exist in a simulation equivalent circuit, represented by the following rational function:

$$f(s) = \sum_{m=1}^{M} \frac{r_m}{s + p_m} + d + se$$

Wherein, the $f(s)$ is a continuation function, $r_m$ is a residue, and $p_m$ is a pole. The function generation module 123 increases accuracy of the rational function $f(s)$ by setting numbers of pole-residue and times for recursion of the interpolation algorithm.

The equivalent circuit generation module 124 is configured for generating a rational function matrix composed with S-parameters by performing a vector fitting algorithm, and generating an equivalent circuit compatible with HSPICE format based on the generated rational function matrix. The equivalent circuit generation module 124 is also configured for determining if a root mean square (RMS) of the error of the rational function matrix is less than selected system errors, and increasing the numbers of pole-residue to perform vector fitting when the system error is more than the RMS of the error of the rational function matrix.

Figure 2:
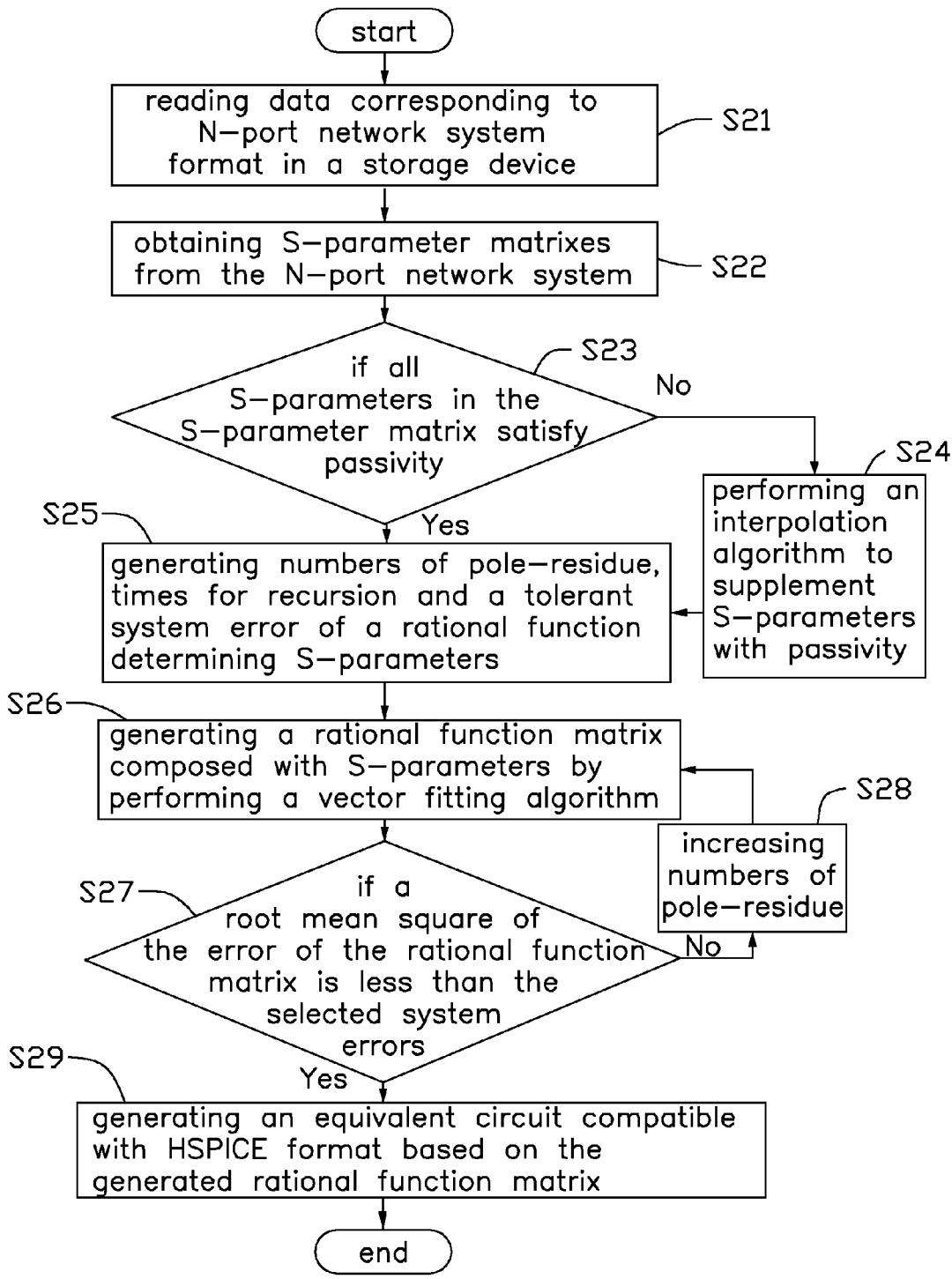
FIG. 2 is a flowchart illustrating one embodiment of a method for generating an equivalent simulation circuit for HSPICE.

FIG. 2 is a flowchart illustrating one embodiment of a method for generating an equivalent simulation circuit for general HSPICE. The equivalent circuit simulation system generates equivalent circuits compatible with HSPICE based on the N-port network data, solves divergence problem and increases simulation performance of a circuit by performing interpolation algorithm to avoid S-parameters falling into the non-passive frequency range.

In block S21, the acquisition module 121 reads Touchstone files of the N-port network, which includes parameters in frequency domain and S-parameters of electronic components in the N-port network from the storage device 10. The Touchstone file is a standard format for stored data, stipulated by IBIS Associates. In block S22, the acquisition module 121 obtains S-parameter matrix from Touchstone file data in the N-port network system. The N-port network system shown in FIG. 3 defines parameters in frequency domain and S-parameters of electronic components. V1 to VN are port voltages of Ports 1 to N, and $I_1$ to $I_N$ are port currents flowing into Ports 1 to N. The S-parameter matrix is a divergence matrix describing relationships between an incident voltage wave and a reflective voltage wave, and S-parameters are parameters in frequency domain built based on the relationship between the incident voltage wave and the reflective voltage wave.

In block S23, the parameter check module 122 checks if all S-parameters satisfy passivity. If the S-parameters in the S-parameter matrix do not satisfy passivity, the block S24 is performed, otherwise, the block S25 is performed.

In block S24, the parameter check module 122 performs interpolation algorithm to supplement S-parameters satisfied with passivity. If S-parameters do not have passivity, the S-parameters of all points in the frequency domain of electronic components should satisfy the formula (1) shown below.

$$I - S^H(s)S(s) > 0 \quad (1)$$

Wherein I is an identity matrix, s=jw, H is a conjugate transpose, also known as Hermitian transpose. Formula (1) filters reference points in the frequency domain of the electronic components, which do not satisfy passivity, and interpolation algorithm supplements passivity of S-parameters before vector fitting is performed.

In block S25, the function generation module 123 defines numbers of pole-residue, times for recursion, and system errors of the rational function f(s). The rational function f(s) is represented by formula (2).

$$f(s) \approx \sum_{m=1}^{M} \frac{r_m}{s + p_m} + d + se \quad (2)$$

Where f(s) is a continuation function, $r_m$ is a residue, and $p_m$ is a pole. The function generation module 123 increases accuracy of the rational function $f(s)$ by setting numbers of pole-residue and times for recursion of the interpolation algorithm.

In block S26, the equivalent circuit generation module 124 generates a rational function matrix composed of S-parameters by performing a vector fitting algorithm based on numbers of pole-residue. In this embodiment, after the parameter check module 122 checks passivity of S-parameters, the S-parameter matrix of the N-port network system is represented by formula (3):

$$S(s) = \begin{bmatrix} S_{11}(s) & S_{12}(s) & \ldots & S_{1N}(s) \\ S_{21}(s) & S_{22}(s) & \ldots & S_{2N}(s) \\ \ldots & \ldots & \ldots & \ldots \\ S_{N1}(s) & S_{N2}(s) & \ldots & S_{NN}(s) \end{bmatrix} \quad (3)$$

The equivalent circuit generation module 124 performs vector fitting on each element of the above formula (3), and obtains a rational function matrix represented by the following formula (4).

$$S(s) \approx \hat{S}(s) = \begin{bmatrix} \hat{S}_{11}(s) & \hat{S}_{12}(s) & \ldots & \hat{S}_{1N}(s) \\ \hat{S}_{21}(s) & \hat{S}_{22}(s) & \ldots & \hat{S}_{2N}(s) \\ \ldots & \ldots & \ldots & \ldots \\ \hat{S}_{N1}(s) & \hat{S}_{N2}(s) & \ldots & \hat{S}_{NN}(s) \end{bmatrix} \quad (4)$$

Where $$\hat{S}_{ij}(s) = \sum_{m=1}^{M} \frac{r_m^{i,j}}{s + p_m^{i,j}} + k^{i,j} + se^{i,j}.$$

In block S27, the equivalent circuit generation module 124 determines if the RMS of the rational function matrix is less than the determined system error. In block S28, if the RMS error is larger than the system error, the equivalent circuit generation module 124 returns to block S26 to perform vector fitting. In block S29, if the RMS error is less than the tolerant error of the system, the equivalent circuit generation module 124 generates an equivalent circuit compatible with HSPICE corresponding to the rational function matrix.

Figure 3:
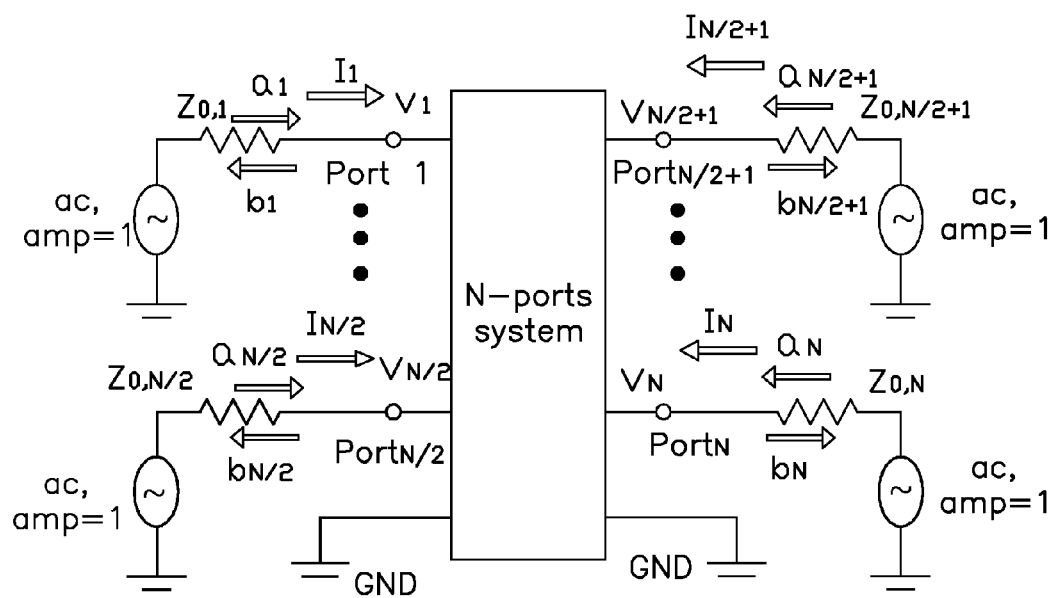
FIG. 3 is a drawing illustrating an exemplary N-port circuit system.

FIG. 3 is a drawing illustrating an N-port network system, wherein a represents an incident wave of the S-parameter, b represents the reflected wave of the S-parameter, and $Z_o$ represents a corresponding referential resistance. The S-parameter of the N port circuit network can be presented as formula (5):

$$b = Sa, \text{ where } a = \begin{bmatrix} a_1 \\ a_2 \\ \ldots \\ a_N \end{bmatrix}, b = \begin{bmatrix} b_1 \\ b_2 \\ \ldots \\ b_N \end{bmatrix} \quad (5)$$

The relationship among the incident wave a, the reflective wave b, the port voltage V and the port current I can be represented by formula (8):

$$a = \frac{1}{2} Z_0^{-1/2}(V + Z_0 I), b = \frac{1}{2} X_0^{-1/2}(V - Z_0 I), \quad (6)$$

Wherein $$V = \begin{bmatrix} V_1 \\ V_2 \\ \ldots \\ V_N \end{bmatrix}, I = \begin{bmatrix} I_1 \\ I_2 \\ \ldots \\ I_N \end{bmatrix}, Z_0 = \begin{bmatrix} Z_{0,1} & 0 & \ldots & 0 \\ 0 & Z_{0,2} & \ldots & 0 \\ \ldots & \ldots & \ldots & \ldots \\ 0 & 0 & \ldots & Z_{0,N} \end{bmatrix}$$

The relationship among voltage, current and S parameters can be obtained by formula (7):

$$I = Z_0^{-1} V - Z_{-1/2} S Z_0^{1/2} (Z_0^{-1} V + 1) \quad (7)$$

Formula (8) can be obtained by substituting the rational function matrix formula (4) into formula (7):

$$\begin{bmatrix} I_1 \\ I_2 \\ \ldots \\ I_N \end{bmatrix} = \begin{bmatrix} \frac{V_1}{Z_{o,1}} \\ \frac{V_2}{Z_{o,2}} \\ \ldots \\ \frac{V_2}{Z_{o,N}} \end{bmatrix} - \begin{bmatrix} \hat{S}_{11}(s) & \hat{S}_{12}(s) & \ldots & \hat{S}_{1N}(s) \\ \hat{S}_{21}(s) & \hat{S}_{22}(s) & \ldots & \hat{S}_{2N}(s) \\ \ldots & \ldots & \ldots & \ldots \\ \hat{S}_{N1}(s) & \hat{S}_{N2}(s) & \ldots & \hat{S}_{NN}(s) \end{bmatrix} \begin{bmatrix} \tilde{V}_1 \\ \tilde{V}_2 \\ \ldots \\ \tilde{V}_N \end{bmatrix}, \quad (8)$$

Wherein $$\tilde{V}_i = \left( \frac{V_i}{Z_{o,i}} + I_i \right)$$

Figure 4:
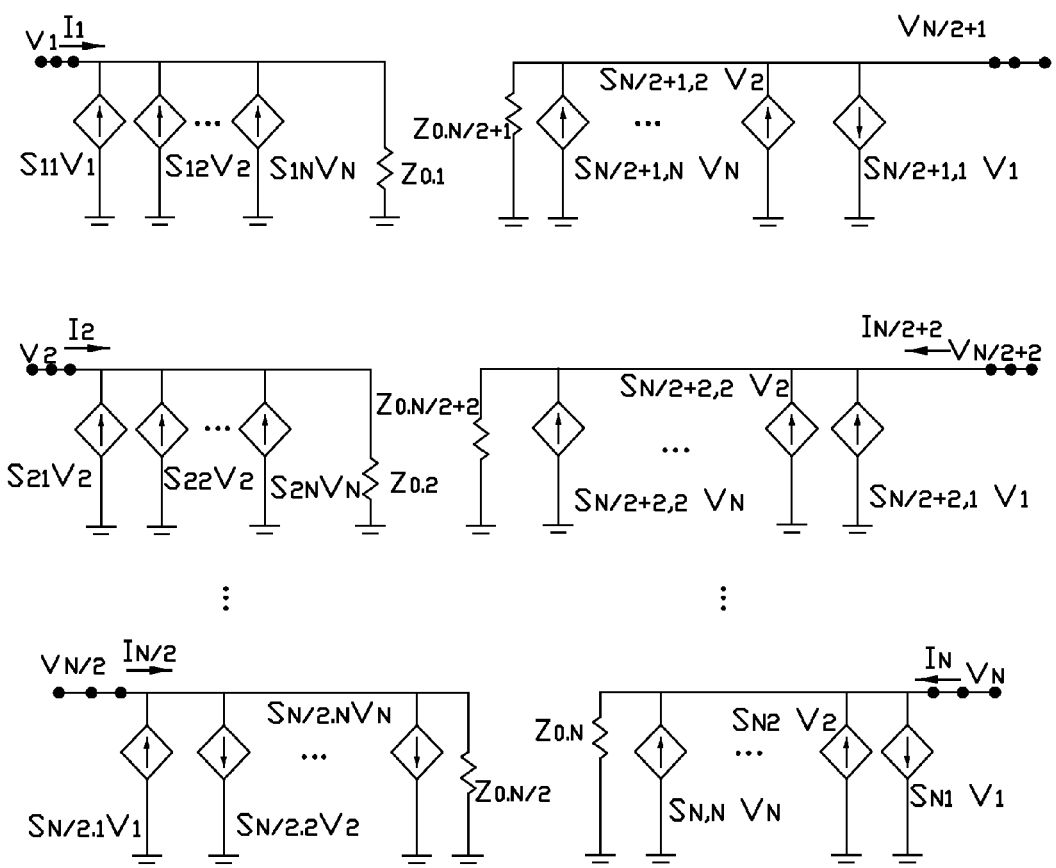
FIG. 4 is a drawing illustrating a main equivalent circuit generated by one embodiment of the equivalent circuit simulation system.
Figure 5:
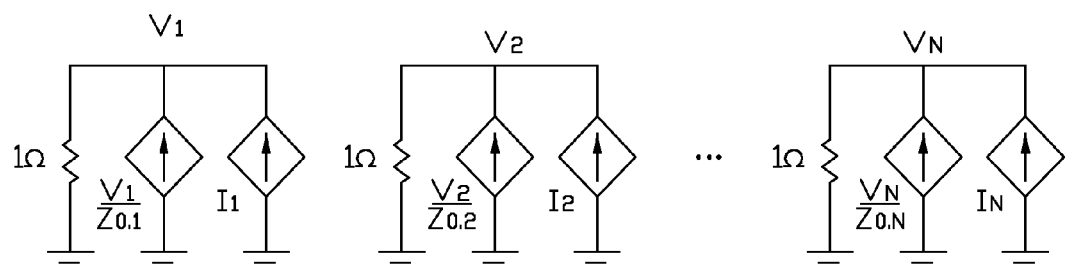
FIG. 5 is a drawing illustrating an exemplary sub-equivalent circuit generated by one embodiment of the equivalent circuit simulation system.

An equivalent circuit shown in FIG. 4 to FIG. 5 can be synthesized according to formula (4) and formula (8), which is compatible with HSPICE.

FIG. 4 illustrates a main equivalent circuit compatible with HSPICE. Voltages $V_1$ to $V_N$ and currents $I_1$ to $I_N$ are supplied by a sub-equivalent circuit shown in FIG. 5. The main circuit The residue of $\hat{S}_{ij}(s)$ can be represented as real parts and complex parts in formula (11):

$$\hat{S}_{ij}(s) = \hat{S}r_{ij}(s) + \hat{S}c_{ij}(s) + k^{i,j} + se^{i,j} \quad (11)$$

$\hat{S}r_{ij}(s)$ and $\hat{S}c_{ij}(s)$ can be represented by formula (12):

$$\hat{S}r_{ij}(s) = \sum_{u=1}^{U} \frac{r_u^{i,j}}{s + p_u^{i,j}}, \quad (12a)$$

$r_u^{i,j} > 0$ for $u < U^+$, $r_u^{i,j} \leq 0$ for $u > U^+$ $$\hat{S}c_{ij}(s) = \sum_{v=1}^{V} \frac{c_v^{i,j} + d_v^{i,j} j}{s + (a_v^{i,j} + b_v^{i,j} j)} + \frac{c_v^{i,j} - d_v^{i,j} j}{s + (a_v^{i,j} - b_v^{i,j} j)}, \quad (12b)$$

$c_v^{i,j} \leq 0$ for $v \leq V^+$, $c_v^{i,j} < 0$ for $v > V^+$

Where $U + 2V = M$, $p_u^{i,j} > 0$, $a_v^{i,j} > 0$, $b_v^{i,j} > 0$, $b_v^{i,j} > 0$, $d_v^{i,j} > 0$.

FIGS. 4 to 6 show equivalent circuits stimulated and synthesized based on formulas (10) to (12). FIG. 5 illustrates a sub-equivalent circuit generated by one embodiment of the equivalent circuit simulation system, which is compatible with HSPICE. A voltage-dependent current source coefficient $\hat{S}_{ij}$ can be described by Laplace Transform in HSPICE environment, as the following:

Gij Vi gnd LAPLACE $\tilde{V}_j$ gnd $k_0^{ij}, k_1^{ij}, \ldots, k_{M+1}^{ij}/d_0^{ij}, d_1^{ij}, \ldots, d_M^{ij}$ Wherein k and d can be obtained by the following formula (9):

$$\hat{S}_{ij} = \sum_{m=1}^{M} \frac{r_m^{i,j}}{s + p_m^{i,j}} + k^{i,j} + se^{i,j} = \frac{k_0^{ij} + k_1^{ij} + \ldots + k_{M+1}^{ij}}{d_0^{ij} + d_1^{ij} + \ldots + d_M^{ij}}. \quad (9)$$

The equivalent circuit generated by the circuit simulation system and method as disclosed is compatible with HSPICE by using N-port network system simulation, avoids complicated Inverse Fourier Transform operations, and increases performance of the equivalent simulation circuits. Furthermore, the present application filters S-parameters in frequency domain without passivity, and solves diverging problems in equivalent circuits.

While the disclosure has been described by way of example and in terms of preferred embodiment, it is to be understood that the disclosure is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A computer system, comprising:
   a central processing unit;
   a storage device storing one or more programs, the one or more programs comprising:
   an acquisition module configured for reading a data file corresponding to N-port network system format in a storage device, and obtaining S-parameter matrixes from an N-port network system;
   a parameter check module configured for checking if all S-parameters in the S-parameter matrix satisfy passivity, and performing an interpolation algorithm to supplement S-parameters with passivity when some S-parameters not satisfy passivity;
   a function generation module configured for generating numbers of pole-residue, times for recursion and a tolerant system error of a rational function that is a function for determining the S-parameters in the S-parameter matrix; and
   an equivalent circuit generation module configured for generating a rational function matrix composed with S-parameters by performing a vector fitting algorithm based on the numbers of pole-residue, and generating an equivalent circuit compatible with HSPICE format based on the generated rational function matrix.

2. The computer system as claimed in claim 1, wherein the equivalent circuit generation module is configured for determining if a root mean square of the error of the rational function matrix is less than the selected system errors, and increasing numbers of pole-residue to perform vector fitting when the system error is more than the root mean square of the rational function matrix.

3. The computer system as claimed in claim 1, wherein the data file corresponding to the N-port network system is in Touchstone file format and stored in the storage device.

4. The computer system as claimed in claim 1, wherein the S-parameter matrix is a divergence matrix describing relationship between an incident voltage wave and a reflective voltage wave in a high frequency circuit.

5. The computer system as claimed in claim 1, wherein the equivalent circuit compatible with HSPICE comprises resistors and data of electronic components of a voltage-dependent current source.

6. A computer-implemented equivalent circuit simulation method for generating an equivalent circuit compatible with HSPICE format, comprising:
   reading data corresponding to N-port network system data file in a storage device;
   obtaining a S-parameter matrix from the N-port network system data file;
   checking if all S-parameters in the S-parameter matrix satisfy passivity;
   performing an interpolation algorithm to supplement S-parameters with passivity when some S-parameters in the S-parameter matrix not satisfy passivity;
   determining numbers of pole-residue, times for recursion and a tolerant system error of a rational function required by the S-parameter matrix;
   generating a rational function matrix composed with S-parameters by performing a vector fitting algorithm based on the numbers of pole-residue; and generating the equivalent circuit compatible with HSPICE format based on the generated rational function matrix.

7. The computer-implemented equivalent circuit simulation method as claimed in claim 6, further comprises steps of:
   determining if a root mean square of the error of the rational function matrix is less than the selected system errors; and
   increasing numbers of pole-residue to perform vector fitting when the system error is more than the root mean square of the rational function matrix.

8. The computer-implemented equivalent circuit simulation method as claimed in claim 6, wherein the N-port network system data file is in Touchstone file format and stored in the storage device.

9. The computer-implemented equivalent circuit simulation method as claimed in claim 6, wherein the S-parameter matrix is a divergence matrix describing relationship between an incident voltage wave and a reflective voltage wave in a high frequency circuit.

10. The computer-implemented equivalent circuit simulation method as claimed in claim 6, wherein the equivalent circuit compatible with HSPICE comprises resistors and data of electronic components of a voltage-dependent current source.

11. A non-transitory computer-readable storage medium having stored thereon instructions that, when executed by a processor, causing the processor to perform an equivalent circuit simulation method for generating an equivalent circuit compatible with HSPICE format, wherein the method comprises:
   reading data corresponding to W element format in a storage device;
   obtaining a frequency-dependent matrix form the data of W element format by using interpolation algorithm;
   transforming a frequency-dependent transmission matrix into a N-port network matrix describing electrical properties of a multi-input and multi-output network;
   determining a range of frequency of a s-parameter by using interpolation algorithm;
   determining numbers of pole-residue, times for recursion and durable maximum system errors in the equivalent circuit simulation;
   producing a rational function matrix composed with s-parameters by performing a vector fitting algorithm based on the numbers of pole-residue; and
   producing the equivalent circuit compatible with HSPICE format based on the generated rational function matrix.

12. The non-transitory computer-readable storage medium as claimed in claim 11, wherein the equivalent circuit simulation method further comprising:
   determining if a root mean square of the error of the rational function matrix is less than the selected system errors; and
   increasing numbers of pole-residue to perform vector fitting when the system error is more than the root mean square of the error of the rational function matrix.

13. The non-transitory computer-readable storage medium as claimed in claim 11, wherein the frequency-dependent transmission matrix is a tabular W element RLGC model comprising information of resistance, inductance, reactance, and capacitance.

14. The non-transitory computer-readable storage medium as claimed in claim 11, wherein the N-port network matrix describing electrical properties of a multi-input and multi-output network, and connection relationship therebetween.

15. The non-transitory computer-readable storage medium as claimed in claim 11, wherein the S-parameter matrix is a diverging matrix describing relationship between an incident voltage wave and a reflective voltage wave in a high frequency circuit.

* * * * *